United States Patent
Ogasawara et al.

(10) Patent No.: US 10,504,686 B2
(45) Date of Patent: Dec. 10, 2019

(54) CHARGED PARTICLE BEAM WRITING METHOD AND CHARGED PARTICLE BEAM WRITING APPARATUS

(71) Applicant: NuFlare Technology, Inc., Yokohama-shi (JP)

(72) Inventors: Munehiro Ogasawara, Hiratsuka (JP); Takanao Touya, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/943,745

(22) Filed: Apr. 3, 2018

(65) Prior Publication Data
US 2018/0342366 A1  Nov. 29, 2018

(30) Foreign Application Priority Data
May 23, 2017 (JP) .................. 2017-101451

(51) Int. Cl.
*H01J 37/141* (2006.01)
*H01J 37/24* (2006.01)
(Continued)

(52) U.S. Cl.
CPC .......... *H01J 37/141* (2013.01); *H01J 37/153* (2013.01); *H01J 37/20* (2013.01); *H01J 37/24* (2013.01);
(Continued)

(58) Field of Classification Search
CPC ...... B82Y 10/00; B82Y 40/00; H01J 37/3174; H01J 2237/2817; H01J 2237/31776;
(Continued)

(56) References Cited

U.S. PATENT DOCUMENTS

| 4,194,116 A * | 3/1980 | Egle | H01J 37/04 250/311 |
| 4,963,737 A * | 10/1990 | Suzuki | H01J 37/141 250/311 |
| 6,215,128 B1 * | 4/2001 | Mankos | G03F 7/2037 250/398 |
| 6,218,676 B1 * | 4/2001 | Nakasuji | B82Y 10/00 250/396 R |

(Continued)

FOREIGN PATENT DOCUMENTS

| JP | 5-175113 | 7/1993 |
| JP | 2004-363085 | 12/2004 |
| JP | 2007-208038 | 8/2007 |

*Primary Examiner* — David A Vanore
(74) *Attorney, Agent, or Firm* — Oblon, McClelland, Maier & Neustadt, L.L.P.

(57) ABSTRACT

A charged particle beam writing method includes forming an aperture image by making a charged particle beam pass through an aperture substrate, changing, in the state where a plurality of crossover positions of the charged particle beam and positions of all of one or more intermediate images of the aperture image are adjusted to matching positions with respect to the aperture image with the first magnification, magnification of the aperture image from the first magnification to the second magnification by using a plurality of lenses while maintaining the last crossover position of the charged particle beam and the position of the last intermediate image of the aperture image to be fixed, and forming, using an objective lens, the aperture image whose magnification has been changed to the second magnification on the surface of the target object, and writing the aperture image.

10 Claims, 8 Drawing Sheets

(51) Int. Cl.
  *H01J 37/153* (2006.01)
  *H01J 37/20* (2006.01)
  *H01J 37/30* (2006.01)
  *H01J 37/317* (2006.01)

(52) U.S. Cl.
  CPC ...... *H01J 37/3007* (2013.01); *H01J 37/3174* (2013.01); *H01J 2237/04922* (2013.01); *H01J 2237/04924* (2013.01); *H01J 2237/141* (2013.01); *H01J 2237/1505* (2013.01); *H01J 2237/31776* (2013.01)

(58) Field of Classification Search
  CPC .. H01J 37/141; H01J 37/28; H01J 2237/0653; H01J 2237/2801; H01J 37/04; H01J 37/063; H01J 37/153; H01J 37/26; H01J 37/265; H01J 37/3045; H01J 37/3177
  USPC ........ 250/311, 396 R, 492.22, 310, 396 ML, 250/492.1, 492.2, 492.3, 492.23; 382/103, 145
  See application file for complete search history.

(56) References Cited

U.S. PATENT DOCUMENTS

| | | | | |
|---|---|---|---|---|
| 7,138,629 | B2* | 11/2006 | Noji | G01N 23/225 250/311 |
| 7,326,943 | B2* | 2/2008 | Ogasawara | B82Y 10/00 250/492.22 |
| 7,772,574 | B2* | 8/2010 | Stengl | B82Y 10/00 250/492.1 |
| 9,673,018 | B2* | 6/2017 | Nomura | H01J 37/14 |
| 2002/0153484 | A1* | 10/2002 | Kaneyama | H01J 37/05 250/311 |
| 2006/0192148 | A1* | 8/2006 | Ogasawara | B82Y 10/00 250/492.22 |
| 2008/0128638 | A1* | 6/2008 | Doering | B82Y 10/00 250/492.2 |
| 2013/0270435 | A1* | 10/2013 | Sohda | H01J 37/153 250/306 |
| 2014/0077078 | A1* | 3/2014 | Hatakeyama | H01J 37/28 250/310 |
| 2015/0287570 | A1* | 10/2015 | Hayashi | H01J 37/222 250/310 |

* cited by examiner

CHARGED PARTICLE BEAM WRITING METHOD AND CHARGED PARTICLE BEAM WRITING APPARATUS

CROSS-REFERENCE TO RELATED APPLICATION

This application is based upon and claims the benefit of priority from the prior Japanese Patent Application No. 2017-101451 filed on May 23, 2017 in Japan, the entire contents of which are incorporated herein by reference.

BACKGROUND OF THE INVENTION

Field of the Invention

Embodiments of the present invention relate to a charged particle beam writing method and a charged particle beam writing apparatus, and, for example, relate to a method for adjusting magnification of an aperture image of an electron beam in the electron beam writing apparatus which irradiates a target object with electron beams.

Description of Related Art

In recent years, with high integration of LSI, the line width (critical dimension) of semiconductor device circuits is decreasing year by year. An electron beam (EB) writing technique which has excellent resolution is used as a method of producing an exposure mask (also referred to as a reticle) for forming a circuit pattern on such semiconductor devices.

Figure 10:
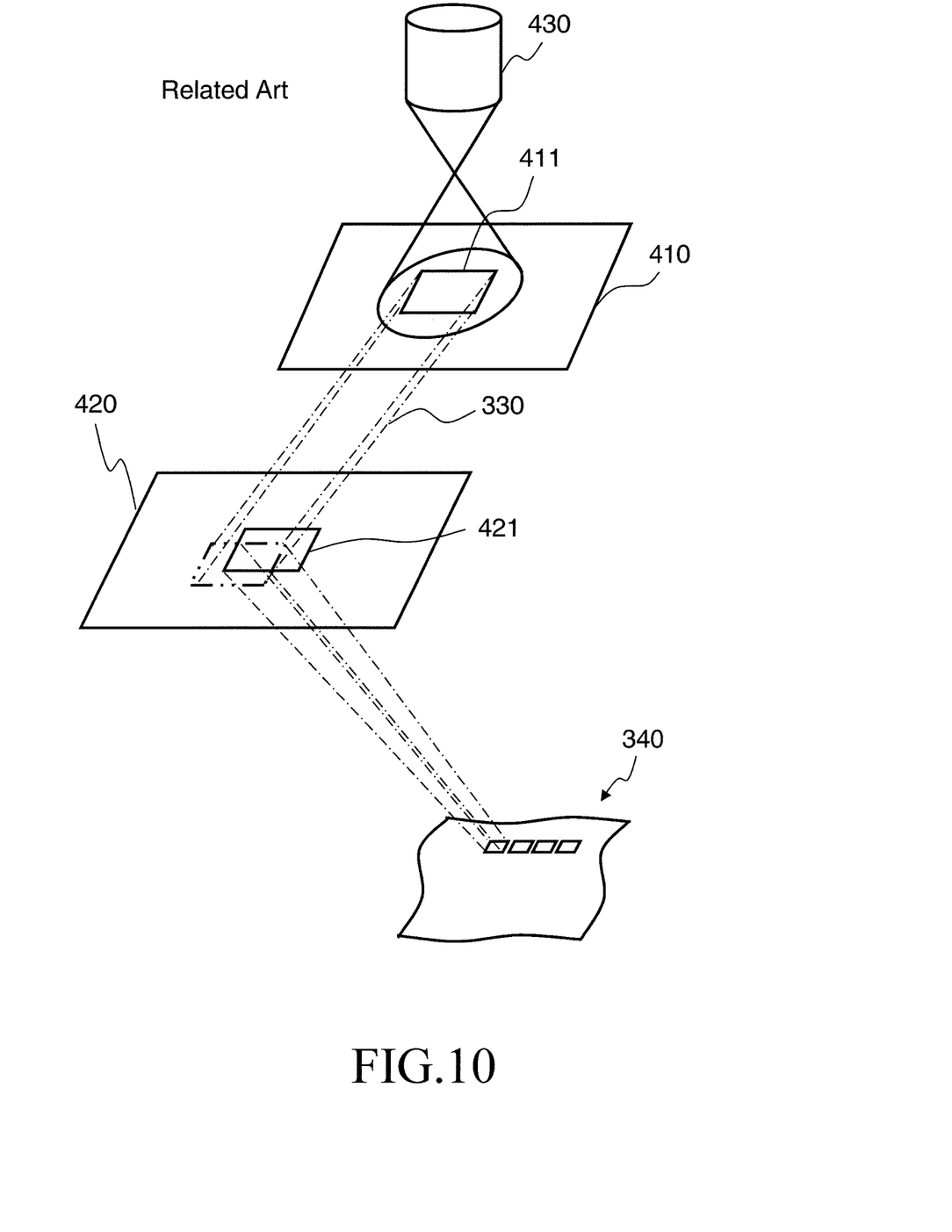
FIG. 10 is a conceptual diagram explaining operations of a variable-shaped electron beam writing apparatus.

FIG. 10 is a conceptual diagram explaining operations of a variable-shaped electron beam writing or "drawing" apparatus. The variable-shaped electron beam writing apparatus operates as described below. A first shaping aperture plate 410 has a quadrangular (rectangular) aperture 411 for shaping an electron beam 330. A second shaping aperture plate 420 has a variable shape aperture 421 for shaping the electron beam 330 having passed through the aperture 411 of the first shaping aperture plate 410 into a desired quadrangular shape. The electron beam 330 emitted from a charged particle source 430 and having passed through the aperture 411 of the first shaping aperture plate 410 is deflected by a deflector so as to pass through a part of the variable shape aperture 421 of the second shaping aperture plate 420, and thereby to irradiate a target object or "sample" 340 placed on a stage which continuously moves in one predetermined direction (e.g., x direction). In other words, a quadrangular shape that can pass through both the aperture 411 of the first shaping aperture plate 410 and the variable shape aperture 421 of the second shaping aperture plate 420 is used for pattern writing in a writing region of the target object 340 on the stage continuously moving in the x direction. This method of forming a given shape by letting beams pass through both the aperture 411 of the first shaping aperture plate 410 and the variable shape aperture 421 of the second shaping aperture plate 420 is referred to as a variable shaped beam (VSB) system.

In accordance with the generation (technical development stage) of pattern layout formed on the mask substrate used as a target object, a required dimension/size of a beam to be shot differs in the electron beam writing apparatus. If under the conditions that the maximum beam current is fixed, in the case of writing a mask including multiple micropatterns, it is advantageous to reduce the writing time by decreasing the maximum beam dimension and increasing the current density so as to secure a beam current even when the beam dimension is very fine. On the other hand, in the case of writing a mask including lots of comparatively large patterns and having a small number of shots as a whole, it is advantageous to increase the maximum beam dimension even if the current density is reduced. The reason is as follows. Between consecutive beam irradiations, the beam is blanked while the beam position is changed from one position to the next position on a mask. This blanking duration is called "settling time". The cumulative settling time is part of a mask writing time. Therefore smaller number fo shots is favorable to achieve a shorter mask writing time.

Further, with respect to a plurality of patterns formed on the same mask, a required dimension/size of a beam to be shot differs between an actual circuit formation portion and a peripheral portion.

In the VSB electron beam writing, since the dimension of a beam irradiating a target object does not become greater than a dimension obtained by reducing the aperture dimension of the first shaping aperture plate 410 by a preset reduction ratio by the optical system, the beam dimension to be shot is restricted by the dimension of the aperture of the first shaping aperture plate 410. Therefore, in order to acquire a size, as a beam dimension, greater than a dimension obtained by reducing the aperture dimension of the first shaping aperture plate 410 by the preset reduction ratio, it is necessary to exchange the first shaping aperture plate 410 for another first shaping aperture plate having a larger aperture dimension. For performing this, there is a problem in that the electron optical column having been maintained in a vacuum state must be released in the atmosphere. Furthermore, changing the illumination optical system which illuminates the first shaping aperture plate 410 may be needed.

Such a problem may occur not only in the VSB electron beam writing but also in the electron beam writing for transferring an aperture image. Further, for example, the same problem may occur also in a multi beam writing apparatus since an aperture array image having passed a shaping aperture array irradiates, as multiple beams, the surface of the target object. Then, it is examined to alter the magnification of an aperture image by further arranging a lens paired with the objective lens. For example, although not concerning the VSB system, there is disclosed adjusting a reduction ratio finely by using a reducing lens paired with the objective lens while changing the height position of the surface of the target object in a transfer apparatus for reducing and transferring a mask image (e.g., refer to Japanese Patent Application Laid-open (JP-A) No. 5-175113). However, this technique just finely adjusts/corrects deviation of a reduction ratio to be a design value. Moreover, since the crossover position peculiar to an electron beam changes, the writing accuracy may be remarkably degraded.

BRIEF SUMMARY OF THE INVENTION

According to one aspect of the present invention, a charged particle beam writing method includes forming an aperture image by making a charged particle beam pass through an aperture substrate; changing, in a state where a plurality of crossover positions of the charged particle beam and positions of all of one or more intermediate images of the aperture image are adjusted to matching positions with respect to the aperture image with a first magnification, magnification of the aperture image from the first magnification to a second magnification by using a plurality of lenses while maintaining a last crossover position of the charged particle beam and a position of a last intermediate image of the aperture image to be fixed; and forming, using an objective lens, the aperture image whose magnification has been changed to the second magnification on a surface of a target object, and writing the aperture image.

According to another aspect of the present invention, a charged particle beam writing apparatus includes an emission source configured to emit a charged particle beam, a stage configured to mount thereon a target object, an aperture substrate configured to form an aperture image by making the charged particle beam pass therethrough, an objective lens configured to focus and form the aperture image on the target object, and a plurality of lenses, arranged between the aperture substrate and the objective lens, configured to change magnification of the aperture image from a first magnification to a second magnification while maintaining a last crossover position of the charged particle beam and a position of a last intermediate image of the aperture image to be fixed.

DETAILED DESCRIPTION OF THE INVENTION

Embodiments below describe an apparatus and method which can adjust magnification of an aperture image while maintaining the writing accuracy in charged particle beam writing.

Moreover, embodiments below describe a configuration using an electron beam as an example of a charged particle beam. The charged particle beam is not limited to the electron beam, and other charged particle beam such as an ion beam may also be used. A variable-shaped beam type writing apparatus will be described as an example of a charged particle beam apparatus.

First Embodiment

Figure 1:
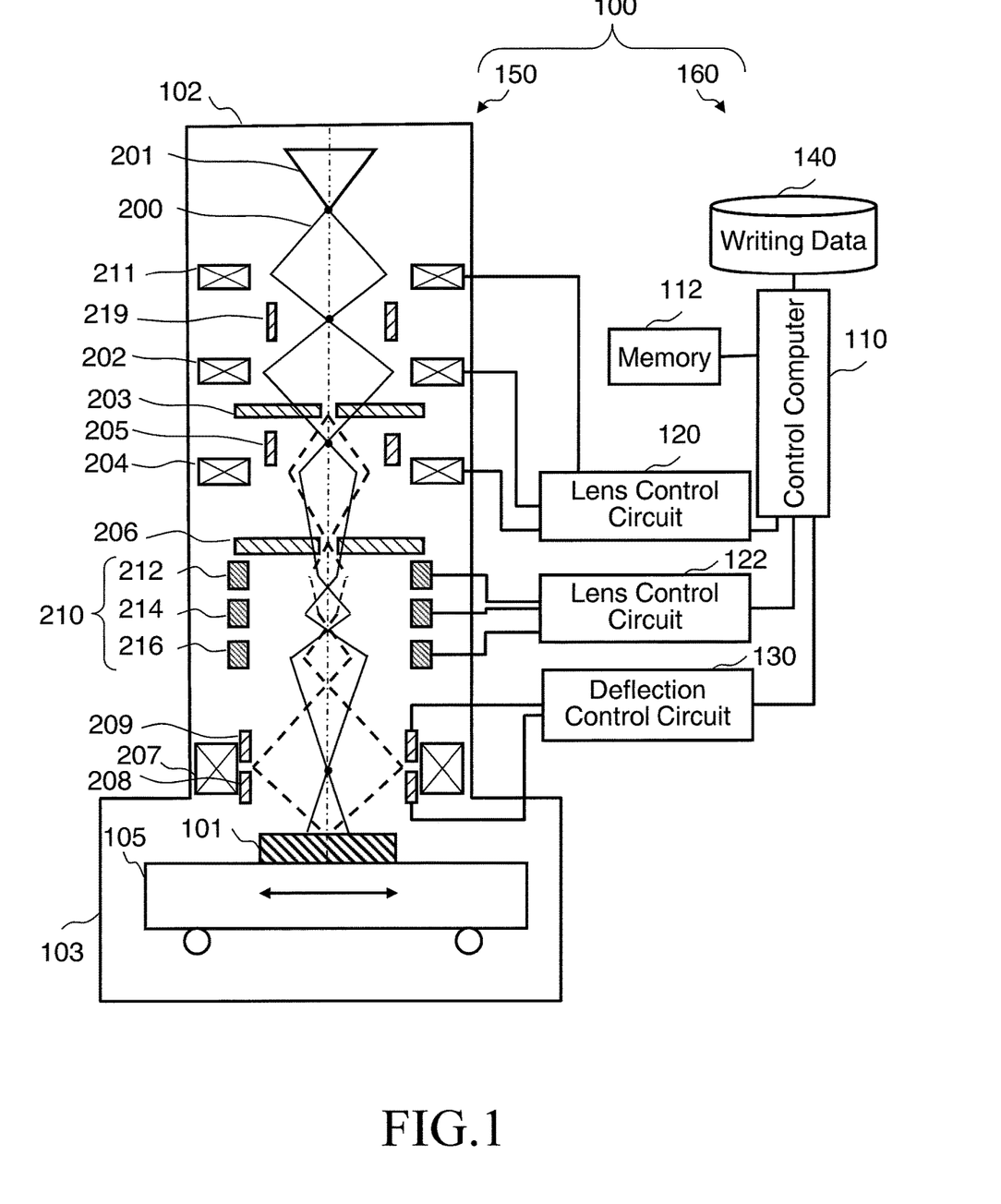
FIG. 1 is a conceptual diagram showing a configuration of a writing apparatus according to a first embodiment.

FIG. 1 is a conceptual diagram showing a configuration of a writing apparatus according to a first embodiment. As shown in FIG. 1, a writing apparatus 100 includes a writing mechanism 150 and a control system 160. The writing apparatus 100 is an example of a charged particle beam writing apparatus. Particularly, it is an example of a variable shaped beam (VSB) type writing apparatus. The writing mechanism 150 includes an electron optical column 102 and a writing chamber 103. In the electron optical column 102 (electron beam column), there are arranged an electron gun 201, an electromagnetic lens (condenser lens) 211, an illumination lens 202, a blanking deflector 219, a first shaping aperture substrate 203, a projection lens 204, a shaping deflector 205, a second shaping aperture substrate 206, a magnification adjustment lens system 210 composed of a plurality of lenses, an objective lens 207, a main deflector 208, and a sub deflector 209. In the writing chamber 103, an XY stage 105 is arranged. On the XY stage 105, there is placed a target object or "sample" 101 such as a mask, etc. serving as a writing target when writing is carried out. For example, the target object 101 is an exposure mask used for manufacturing semiconductor devices. The target object 101 may be, for example, a mask blank on which resist has been coated and nothing has yet been written. For example, a pair of electrodes is used as the blanking deflector 219.

The magnification adjustment lens system 210 is composed of three or more electrostatic lenses, or four or more electromagnetic lenses. In the case of FIG. 1, the magnification adjustment lens system 210 includes three electrostatic lenses 212, 214, and 216. Moreover, the magnification adjustment lens system 210 is arranged between the second shaping aperture substrate 206 and the objective lens 207, and furthermore between the second shaping aperture substrate 206 and the sub deflector 209.

The control system 160 includes a control computer 110, a memory 112, a lens control circuit 120, a lens control circuit 122, a deflection control circuit 130, and a storage device 140 such as a magnetic disk drive. The memory 112, the lens control circuits 120 and 122, the deflection control circuit 130, and the storage device 140 are connected by a bus (not shown) to the control computer 110 which controls the whole of the control system 160.

The lens control circuit 120 is connected to a plurality of electromagnetic lenses such as the electromagnetic lens 211, the illumination lens 202, the projection lens 204, and the objective lens 207, which are other than the magnification adjustment lens system 210, and controls these plurality of electromagnetic lenses.

The lens control circuit 122 is connected to a plurality of lenses of the magnification adjustment lens system 210, such as the three electrostatic lenses 212, 214, and 216, and controls these plurality of lenses.

The deflection control circuit 130 controls the blanking deflector 219, the shaping deflector 205, the main deflector 208, and the sub deflector 209.

FIG. 1 shows a configuration necessary for explaining the first embodiment. Other configuration elements generally necessary for the writing apparatus 100 may also be included. For example, although a multistage deflector of two stages of the main deflector 208 and the sub deflector 209 is herein used for position deflection, a single stage deflector or a multistage deflector of three or more stages may also be used for position deflection. Moreover, for example, an input device, such as a mouse and a keyboard, and a monitoring device may be connected to the writing apparatus 100.

Figure 2:
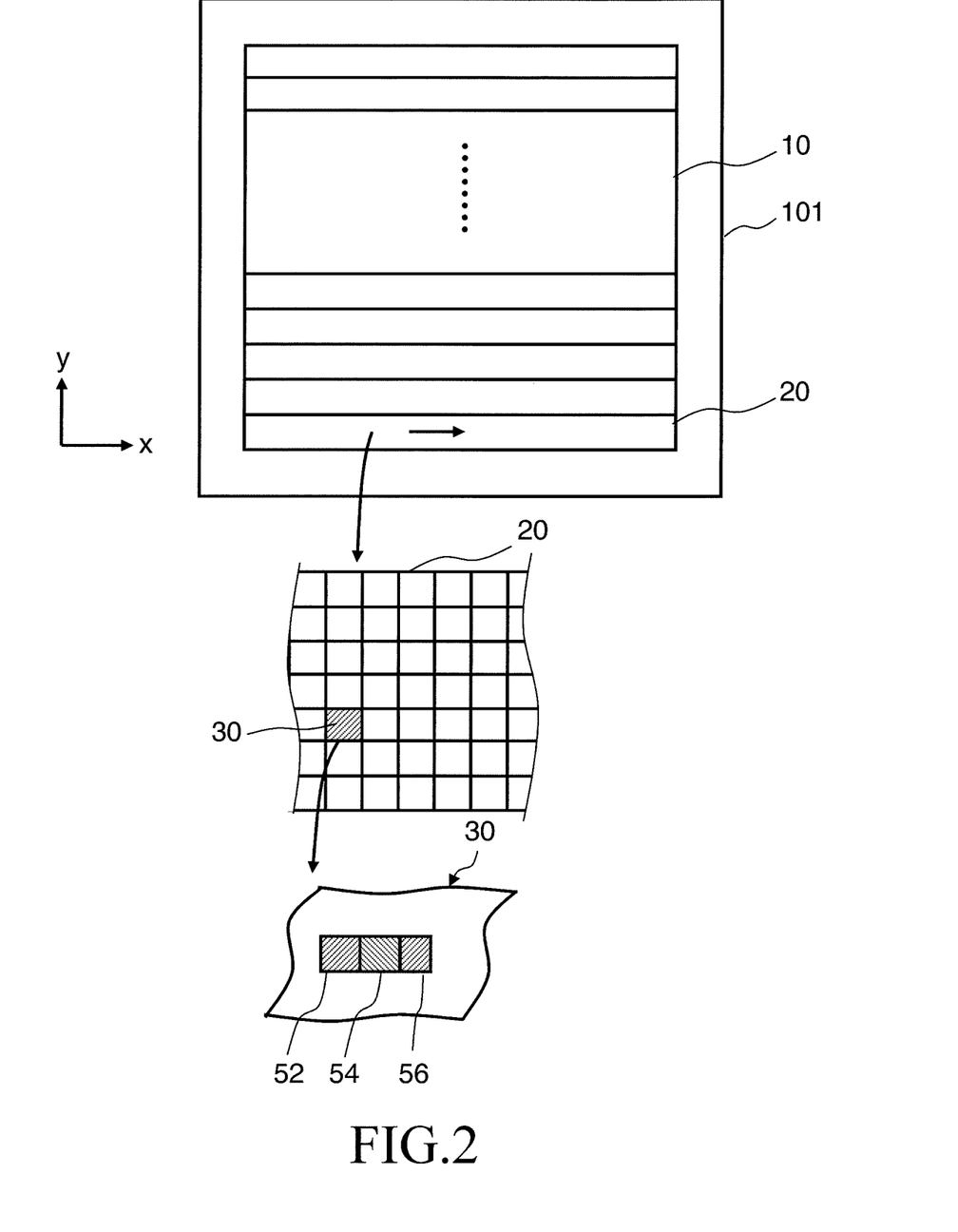
FIG. 2 is a conceptual diagram for explaining each region according to the first embodiment.

FIG. 2 is a conceptual diagram for explaining each region according to the first embodiment. As shown in FIG. 2, a writing region 10 of the target object 101 is virtually divided in the y direction, for example, into a plurality of stripe regions 20 each being in a stripe shape and each having a width deflectable in the y direction by the main deflector 208. Further, each of the stripe regions 20 is virtually divided in the x direction, for example, into a plurality of subfields (SFs) 30 (small regions) each having a size deflectable by the sub deflector 209. Shot figures 52, 54, and 56 are written at corresponding shot positions in each SF 30.

A digital signal for controlling blanking is output from the deflection control circuit 130 to a blanking amplifier (not shown). In the blanking amplifier, a deflection voltage pulse of pulse width based on the digital signal is generated, and applied to the blanking deflector 219. An electron beam 200 is deflected by this deflection voltage, and blocked by the shaping aperture substrate 203, thereby not reaching the target object 101. On the other hand, when the deflection voltage for blanking is not applied, an electron beam can reach the target object 101. Thus, the irradiation time (dose) of each shot is controlled.

A digital signal for controlling shaping is output from the deflection control circuit 130 to a DAC amplifier (not shown). Then, in the DAC amplifier for controlling shaping, the digital signal is converted to an analog signal, and amplified to be applied as a deflection voltage to the shaping deflector 205. The electron beam 200 is deflected by this deflection voltage and shaped to be an electron beam of a desired shape and size.

A digital signal for controlling main deflection is output from the deflection control circuit 130 to a DAC amplifier (not shown). Then, in the DAC amplifier for controlling main deflection, the digital signal is converted to an analog signal and amplified to be applied as a deflection voltage to the main deflector 208. The electron beam 200 is deflected by this deflection voltage, and thereby each shot beam is deflected to a reference position in a target SF 30 in the virtually divided mesh like SFs.

A digital signal for controlling sub deflection is output from the deflection control circuit 130 to a DAC amplifier (not shown). Then, in the DAC amplifier for controlling sub deflection, the digital signal is converted to an analog signal and amplified to be applied as a deflection voltage to the sub deflector 209. The electron beam 200 is deflected by this deflection voltage, and thereby each shot beam is deflected to each shot position in the target SF 30.

The writing apparatus 100 performs writing processing in each stripe region 20 by using a multistage deflector of a plurality of stages. Here, as an example, a two-stage deflector composed of the main deflector 208 and the sub deflector 209 is used. While the XY stage 105 is continuously moving in the −x direction, for example, writing is performed in the x direction in the first stripe region 20. After the writing has been finished in the first stripe region 20, writing is performed in the same direction or in the opposite direction in the second stripe region 20. Then, in the same way, writing is performed in the third and subsequent stripe regions 20.

The main deflector 208 sequentially deflects the electron beam 200 to a reference position of the SF 30 such that the movement of the XY stage 105 is followed. The sub deflector 209 deflects the electron beam 200 from the reference position of each SF 30 to each shot position of an irradiating beam in the SF 30 concerned. Thus, the sizes of the deflection regions of the main deflector 208 and the sub deflector 209 are different from each other. The SF 30 is the smallest deflection region in the deflection regions of the multistage deflector.

The electron beam 200 emitted from the electron gun 201 (emission source) is converged by the electromagnetic lens 211 at the central height position (an example of a predetermined position) in the blanking deflector 219, for example, and a convergence point (crossover image: C.O., hereinafter, crossover image is also called a crossover) is formed. Under the conditions using deflection electrodes of a single stage as the blanking deflector 219, the center height of the deflector serves as a fixed point of the deflection operation. In the case of using deflection electrodes of multiple stages as the blanking deflector 219, the electron beam 200 converges at the deflection fixed point (pivoting point) of the deflection electrodes of the multiple stages. Then, when passing through the blanking deflector 219 which is arranged on the downstream side compared to the electromagnetic lens 211 with respect to the direction of the optical axis, "beam on" or "beam off" is controlled by the blanking deflector 219. Expressed in another way, the blanking deflector 219 deflects the electron beam when performing blanking control of switching between "beam on" and "beam off". The electron beam having been deflected to be in a "beam off" state is blocked by the first shaping aperture substrate 203 (also functioning as a blanking aperture substrate) arranged on the downstream side of the blanking deflector 219 with respect to the direction of the optical axis. That is, when in the "beam on" state, it is controlled to pass through the first shaping aperture substrate 203, and when in the "beam off" state, it is deflected such that the entire beam is blocked by the first shaping aperture substrate 203. The electron beam 200 that has passed through the first shaping aperture substrate 203 during the period from becoming a "beam on" state from a "beam off" state to again becoming a "beam off" state serves as one shot of the electron beam. The blanking deflector 219 controls the direction of the passing electron beam 200 in order to alternately generate a "beam on" state and a "beam off" state. For example, when in the "beam on" state, a voltage of 0V is applied (or no voltage is applied) to the blanking deflector 219, and, when in the "beam off" state, a voltage of several V is applied to it. The dose per shot of the electron beam 200 to irradiate the target object 101 is adjusted depending upon an irradiation time t of each shot.

The electron beam 200, having passed through the blanking deflector 219 while keeping the "beam on" state, irradiates the whole of a quadrangular hole (first shaping aperture) formed on the first shaping aperture substrate 203 by the illumination lens 202. Then, first, the electron beam 200 is shaped to be a quadrangle. After passing through the first shaping aperture substrate 203, the electron beam 200 of the first aperture image is projected onto the second shaping aperture substrate 206 by the projection lens 204. The first aperture image on the second shaping aperture substrate 206 is deflection-controlled by the deflector 205 so as to change (variably shape) the shape and size of the beam. Such variable beam shaping is performed for each shot, and, generally, each shot is shaped to have a different beam shape and size. In other words, the second aperture image (aperture image) is formed by making the electron beam 200 of the first aperture image pass through the second shaping aperture substrate 206 (aperture substrate). Then, after passing through the second shaping aperture substrate 206, the electron beam 200 of the second aperture image is focused to form an image on the target object 101 by the objective lens 207, and deflected by the main deflector 208 and the sub deflector 209 to reach a desired position on the target object 101 placed on the XY stage 105 which moves continuously. FIG. 1 shows the case of using multiple stage deflection of the main and sub deflection for position deflection. In such a case, the main deflector 208 may deflect the electron beam 200 of the shot concerned to the reference position in an SF 30 while following the movement of the stage, and the sub deflector 209 may deflect the beam of the shot concerned to each irradiation position in the SF. A figure pattern defined in writing data is written by repeating such operations and combining the shot figure of each shot.

As the shape of the aperture formed in the second shaping aperture substrate 206, the shape including an oblique side can also be used other than a quadrangle. Thereby, a triangle beam of an arbitrary size can also be generated.

According to the first embodiment, before deflecting the second aperture image by the main deflector 208 and the sub deflector 209, magnification adjustment is performed by the magnification adjustment lens system 210 composed of a plurality of lenses 212, 214, and 216 in order to obtain a desired magnification.

Figure 3A:
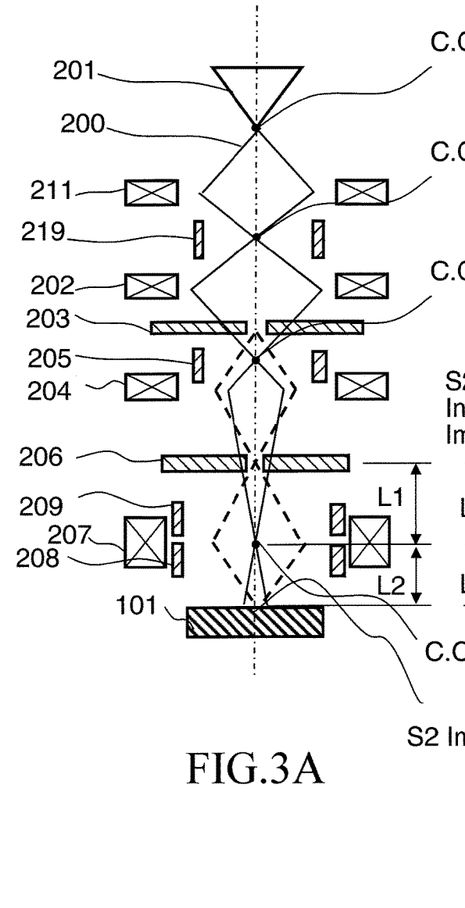
FIGS. 3A and 3B show examples of a trajectory of the crossover system of an electron beam and a trajectory of the image forming system of an aperture image according to the first embodiment and a comparative example.
Figure 3B:
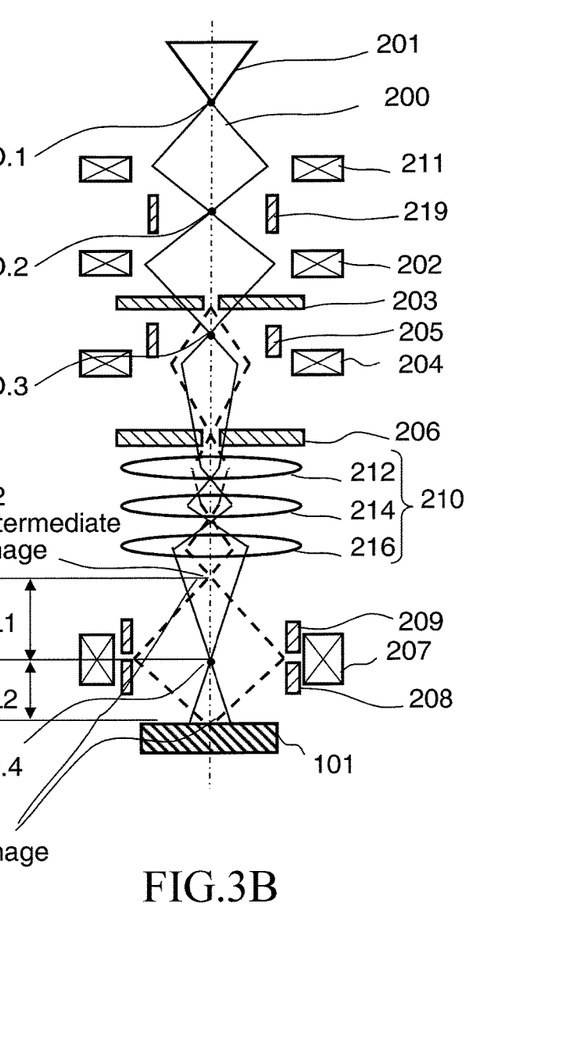

FIGS. 3A and 3B show examples of a trajectory of the crossover system of an electron beam and a trajectory of the image forming system of an aperture image according to the first embodiment and a comparative example. In the comparative example, as shown in FIG. 3A, the emitted electron beam 200 converges at a point, which is named a convergence point 1 (crossover 1: C.O.1), near the exit of the electron gun 201. Next, while passing through the blanking deflector 219, the electron beam 200 converges at a point, which is named a convergence point 2 (C.O.2). Next, while passing through the shaping deflector 205, the electron beam 200 converges at a point, which is named a convergence point 3 (C.O.3). Next, while passing through the objective lens 207, the electron beam 200 converges at a point, which is named a convergence point 4 (C.O.4). Then, the electron beam converged by the objective lens 207 irradiates the surface of the target object 101. At this time, the first aperture image formed by the first shaping aperture substrate 203 is focused to form an image on the surface of the second shaping aperture substrate 206 by the projection lens 204. The image (hereafter called a "second aperture image" and abbreviated as S2 image) of a beam section at the second aperture position formed by the second aperture formed in the second shaping aperture substrate 206 is focused to form an image on the surface of the target object 101 by the objective lens 207.

First, the height position of the convergence point 4 (C.O.4) being the last crossover position is adjusted to the central height position of the objective lens 207. "The central height position of the objective lens 207" here means the position where, when the convergence point 4 (C.O.4) is at the position, the size of an image on the surface of the target object does not change at the time of changing the focal distance by changing excitation of the objective lens 207. Excitations of the electromagnetic lens 211, the illumination lens 202, the projection lens 204, and the objective lens 207 are adjusted. Thereby, even when a focus position is changed by the objective lens 207, it is possible to form the convergence point 4 (C.O.4) at the position where the beam dimension is fixed (unchanged) although there is a difference that the image formed on the surface of the target object 101 changes to be focused or blurred. The height position of the convergence point 2 (C.O.2) is adjusted to the central height position of the blanking deflector 219 by using the electromagnetic lens 211. Thereby, even when the blanking voltage changes, deviation of the irradiation position resulting from this change can be prevented. Then, the height position of the convergence point 3 (C.O.3) is adjusted to the central height position of the shaping deflector 205 by using the illumination lens 202. Under the conditions using deflection electrodes of a single stage, the center height of the deflector serves as a fixed point in the deflection operation. In the case of using deflection electrodes of multiple stages, the electron beam 200 converges at the deflection fixed point of the deflection electrodes of the multiple stages. Thereby, deviation of the irradiation position resulting from the shaping dimension of an electron beam can be prevented. At this time, the projection lens 204 focuses the aperture image of the first shaping aperture substrate 203 on the second shaping aperture substrate 206. Under the conditions of image formation described above, the optical system is designed such that the height position of C.O.4 is located at the central height position of the objective lens 207. Therefore, in the beam calibration operation performed before the writing processing in the writing apparatus, crossover positions of the electromagnetic lens 211, the illumination lens 202, and the projection lens 204 are adjusted by excitation adjustment of these lenses, etc. Strictly, when the lens magnetic field, etc. has been shifted from the design value, crossover image formation conditions and shaping aperture image formation conditions are incompatible. In such a case, the position conditions of C.O.3 described above may be somewhat mitigated. If this mitigation causes deviation of beam irradiation position, which depends on shaping deflection, it should be corrected using the sub deflector 209. In the comparative example, it is difficult to change magnification of the second aperture image (S2 image) after each crossover position has been adjusted. Therefore, as described above, in the VSB electron beam writing in the comparative example, since the maximum dimension (dimension of second aperture image (S2 image)) of a beam irradiating the target object 101 does not become greater than a dimension obtained by reducing the aperture dimension of the first shaping aperture substrate 203 by a preset reduction ratio by the reduction optical system composed of the projection lens 204 and the objective lens 207, the beam dimension to be shot is restricted by the dimension of the aperture of the first shaping aperture substrate 203. Therefore, in order to acquire a size, as a beam dimension, greater than a dimension obtained by reducing the aperture dimension of the first shaping aperture substrate 203 by a preset reduction ratio, it is necessary to exchange the first shaping aperture substrate for another first shaping aperture substrate having a larger aperture dimension. For performing this, there is a problem in that the electron optical column having been maintained in a vacuum state must be released in the atmosphere. Furthermore, changing the illumination optical system, such as the illumination lens 202, which illuminates the first shaping aperture substrate 203 may be needed.

However, as described above, it is desired to variably adjust the dimension (dimension of second aperture image (S2 image)) of a beam irradiating the target object 101, in accordance with the generation (technical development stage) of pattern layout, etc. Then, according to the first embodiment, as shown in FIG. 3B, the dimension of the second aperture image (S2 image) is variably adjusted by arranging the magnification adjustment lens system 210 between the second shaping aperture substrate 206 and the objective lens 207. In such a case, what is important is not to change, before and after magnification adjustment, the distance L1 between the height position of the convergence point 4 (C.O.4) and the position of the last intermediate image of the second aperture image (S2 image). Expressed in another way, the position of the convergence point 4 (C.O.4) being the last crossover position and the position of the last intermediate image of the second aperture image (S2 image) should be kept fixed (unchanged) before and after the magnification adjustment. Since the arrangement height of the objective lens 207 with respect to the surface of the target object 101 has already been defined, the central height position L2 of the objective lens 207 with respect to the surface of the target object 101 is fixed. On that basis, if the distance L1 between the height position of the convergence point 4 (C.O.4) and the position of the last intermediate image of the second aperture image (S2 image) is fixed (unchanged), the position of the convergence point 4 (C.O.4) can be the central height position of the objective lens 207. Thereby, even when the focus position is changed by the objective lens 207, the beam dimension can be made fixed (unchanged) although there is a difference that the image formed on the surface of the target object 101 changes to be focused or blurred. In the comparative example shown in FIG. 3A, since only the objective lens 207 is arranged between the second shaping aperture substrate 206 and the surface of the target object 101, the second aperture image (S2 image) is formed on the surface of the target object 101 without forming any intermediate image of the second aperture image (S2 image). On the other hand, according to the first embodiment, since the magnification adjustment lens system 210 composed of a plurality of lenses (212, 214, and 216) is arranged between the second shaping aperture substrate 206 and the surface of the target object 101, the second aperture image (S2 image) is formed on the surface of the target object 101 by interposing one or more intermediate images between the second aperture image and the target object 101. In other words, one or more intermediate images of the second aperture image (S2 image) are formed by at least one of the plurality of the lenses (212, 214, and 216) described above.

Thus, in order to keep the position of the convergence point 4 (C.O.4) being the last crossover position and the position of the last intermediate image of the second aperture image (S2 image) fixed (unchanged) before and after the magnification adjustment, three or more electrostatic lenses 212, 214, and 216 for adjusting the three parameters of the magnification, the image formation position of the last intermediate image, and the position of the convergence point 4 (C.O.4) are needed as the magnification adjustment lens system 210. In the case of configuring the magnification adjustment lens system 210 by using electromagnetic lenses, since image rotation adjustment is further added as a parameter, four or more electromagnetic lenses are needed.

In the meanwhile, if an actual image is formed using one lens, the rotating direction of the formed image on the image surface (surface of the height position of an image point) is opposite to the rotating direction of that on the object surface (surface of the height position of an object point). In the description in this specification, when expressed as "no image rotation", it means "image is not rotated except that it is reversed". If capable of generating a quadrangular beam, or four types of isosceles right triangles, the "image reverse" is not practically a problem.

In the example of FIG. 3A, by adding an auxiliary lens between the first shaping aperture substrate and the shaping deflector 205 or between the second shaping aperture substrate 206 and the objective lens 207, it becomes possible to make an adjustment such that the image formation conditions of C.O.3 and C.O.4, and the image formation conditions of a shaping aperture image are strictly compatible. However, also in this case, since the reduction ratio is defined by excitation of the auxiliary lens and the objective lens, it is impossible to make an adjustment to be an arbitrary reduction ratio.

Figure 4:
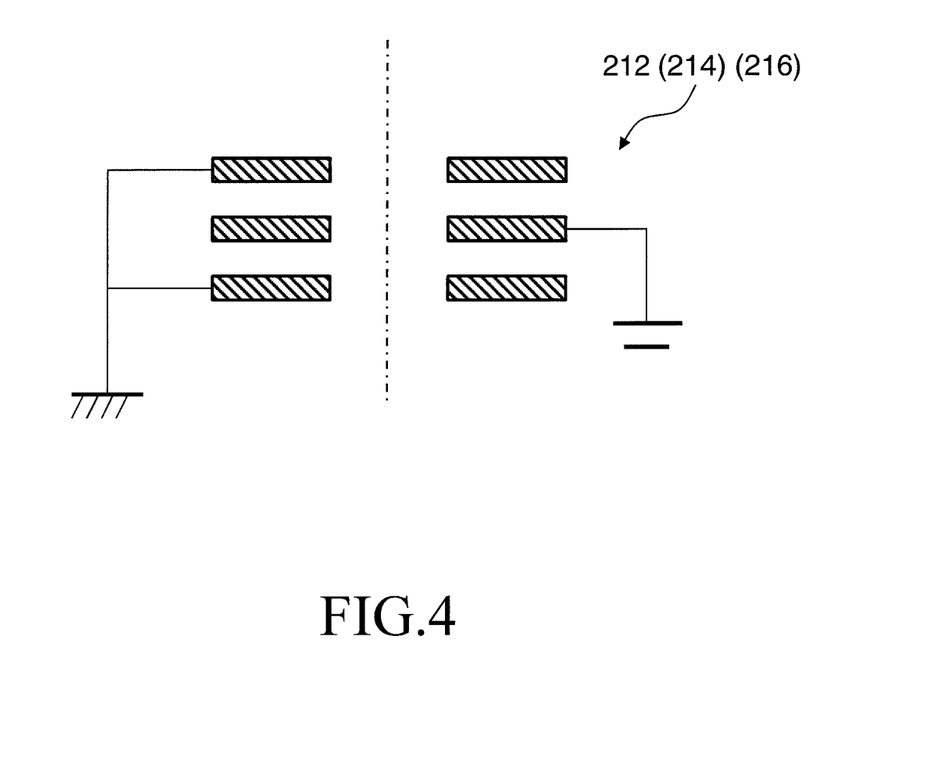
FIG. 4 shows a structure of one electrostatic lens according to the first embodiment.

FIG. 4 shows a structure of one electrostatic lens according to the first embodiment. As shown in FIG. 4, each of the electrostatic lenses 212, 214, and 216 is configured by three annular (hollow disc) electrodes, where while the upper and lower electrodes are maintained at ground potential (GND), a voltage Vd being positive (or negative) to the ground potential is applied to the middle electrode. The lens strength can be adjusted by adjusting the voltage Vd. The adjacent electrostatic lenses can share the electrode(s) at ground potential.

One electromagnetic lens can generate an axial lens magnetic field by one coil for excitation, and is a unit configuration for controlling the size of the axial lens magnetic field. Generally, one electromagnetic lens is configured by one or more coils and a pole piece made of ferromagnetic material, such as iron surrounding the coil. In the pole piece, one or more openings are provided so that a lens magnetic field may be locally generated on the axis. Moreover, adjacent two or more electromagnetic lenses may share a part of the pole piece structure.

Figure 5:
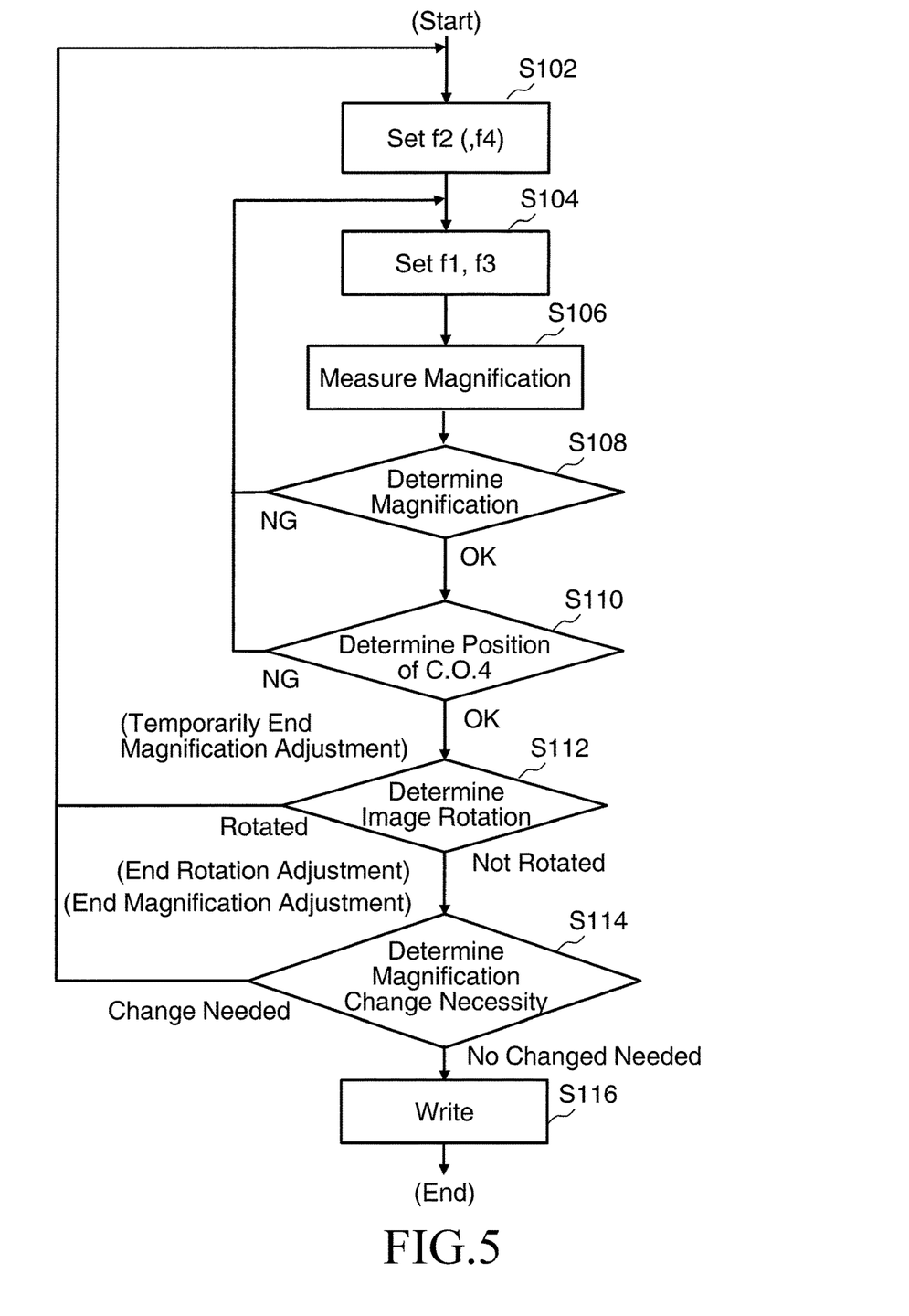
FIG. 5 is a flowchart showing main steps of a writing method according to the first embodiment.

FIG. 5 is a flowchart showing main steps of a writing method according to the first embodiment. In FIG. 5, the writing method of the first embodiment executes a series of steps: a second (and fourth) lens value setting step (S102), a first and third lens values setting step (S104), a magnification measurement step (S106), a magnification determination step (S108), a last crossover (C.O.4) position determination step (S110), an image rotation determination step (S112), a magnification change necessity determination step (S114), and a writing step (S116).

In the second (and fourth) lens value setting step (S102), the lens control circuit 122 sets a lens value f2 (f4) of the electrostatic lens 214.

In the first and third lens values setting step (S104), the lens control circuit 122 sets lens values f1 and f3 of the electrostatic lenses 212 and 216.

In the magnification measurement step (S106), the size of a shot figure which has been set to a predetermined shot size in the writing apparatus 100 is measured. For example, the size of the image of the shot figure is measured by scanning a mark (not shown) on the XY stage 105 and detecting a secondary electron including a reflected electron by a detector (not shown). Alternatively, the size of the shot figure may be measured by writing the shot figure on an evaluation substrate coated with resist, and measuring the resist pattern after development by a dimension measuring instrument.

In the magnification determination step (S108), it is determined whether the size (beam dimension) of the measured shot figure has a desired magnification, (magnification #1). In the case of not being the magnification #1, it returns to the first and third lens values setting step (S104), and repeats, while variably changing first and third lens values, the steps from the first and third lens values setting step (S104) to the magnification determination step (S108) until it becomes the magnification #1. In the case of being the magnification #1, it progresses to the last crossover (C.O.4) position determination step (S110).

In the last crossover (C.O.4) position determination step (S110), it is determined whether the position of the convergence point 4 (C.O.4) being the last crossover position is the central height position of the objective lens 207. Specifically, the size of the shot figure at each focus position is measured when shifting the focus position by variably changing the excitation value at which the lens control circuit 120 excites the objective lens 207. In order to obtain the size of the shot figure, the size of the image of the shot figure is measured, where the image of the shot figure is obtained by scanning a mark (not shown) on the XY stage 105 and detecting a secondary electron including a reflected electron by a detector (not shown). Alternatively, the size of the shot figure may be measured by writing the shot figure on an evaluation substrate coated with resist, and measuring the resist pattern after development by a dimension measuring instrument. Then, when the size of the shot figure at each focus position does not change, it is determined that the position of the convergence point 4 (C.O.4) being the last crossover position is the central height position of the objective lens 207. When the size of the shot figure at each focus position changes, it returns to the first and third lens values setting step (S104), and repeats the steps from the first and third lens values setting step (S104) to the determination step (S110) until the size of the shot figure at each focus position becomes unchanged. At the time of the size of the shot figure at each focus position becoming unchanged, the magnification adjustment ends temporarily. Then, when the size of the shot figure at each focus position does not change, it progresses to the image rotation determination step (S112).

Figure 6:
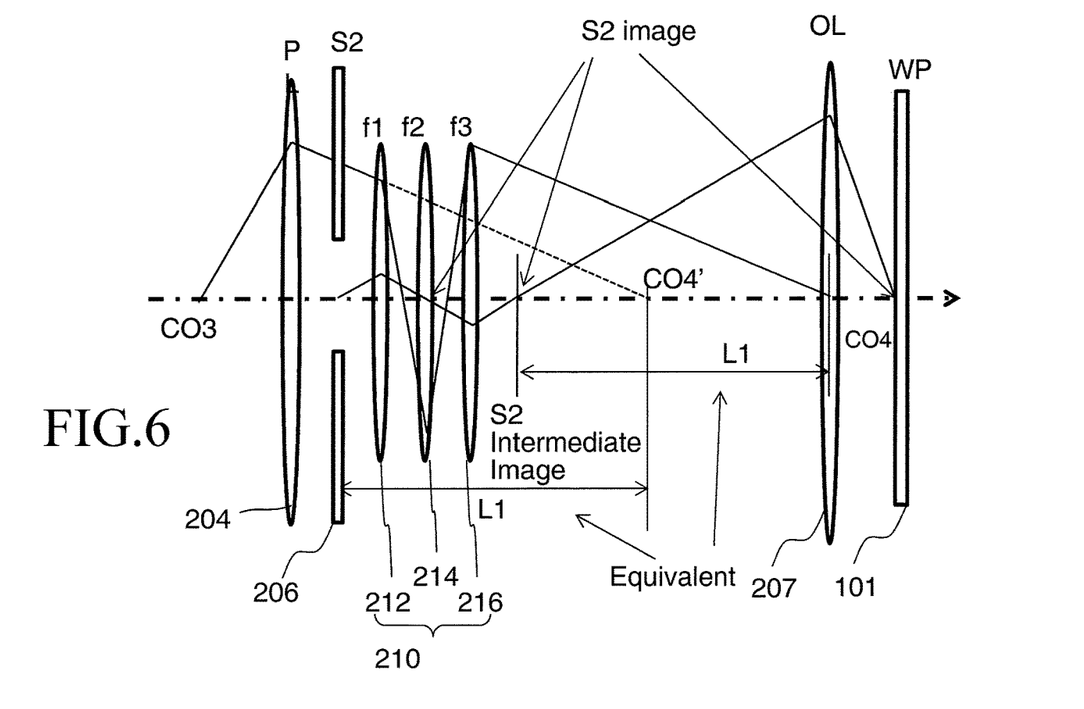
FIG. 6 shows an example of a trajectory of the crossover system of an electron beam and a trajectory of the image forming system of an aperture image in the case of adjusting magnification by using three electrostatic lenses according to the first embodiment.

FIG. 6 shows an example of a trajectory of the crossover system of an electron beam and a trajectory of the image forming system of an aperture image in the case of adjusting magnification by using three electrostatic lenses according to the first embodiment. FIG. 6 shows an example of the crossover system trajectory of the electron beam 200 from the convergence point 3 (C.O.3) to the convergence point 4 (C.O.4), and an example of the image forming system trajectory of the second aperture image (S2 image) formed by the second shaping aperture substrate 206. The electron beam 200 having passed the convergence point 3 (C.O.3) is refracted by the projection lens 204, and converges toward the convergence point 4' (C.O.4'). When the three electrostatic lenses 212, 214, and 216 are not arranged, the objective lens 207 is in design arranged at the position of the convergence point 4' (C.O.4'). In other words, when the three electrostatic lenses 212, 214, and 216 are not arranged, each of the heights of the objective lens 207 and the surface of the target object 101 (target object arrangement plane of the XY stage 105) is shifted toward the optical axis upper part by the distance between the convergence point 4' (C.O.4') and the convergence point 4 (C.O.4). According to the first embodiment, the crossover position is moved to the convergence point 4 (C.O.4) from the convergence point 4' (C.O.4') by the lens effect (action) of the three electrostatic lenses 212, 214, and 216. In that case, it is set such that the distance between the plane where the second aperture image (S2 image) is formed by the second shaping aperture substrate 206 and the convergence point 4' (C.O.4') is equal to the distance between the last intermediate image of the second aperture image (S2 image) at the time of repeating image formation once or more by the lens effect (action) of the three electrostatic lenses 212, 214, and 216 and the convergence point 4 (C.O.4), namely it is set such that both the distances are the same L1.

In the image rotation determination step (S112), it is determined whether rotational deviation has occurred, on the surface of the target object 101, in the second aperture image (S2 image) which has become a shot figure of desired magnification. Specifically, rotational deviation of an image of the shot figure is measured by scanning a mark (not shown) on the XY stage 105 and detecting a secondary electron including a reflected electron by a detector (not shown). When rotational deviation has occurred in the second aperture image (S2 image) on the surface of the target object 101, it returns to the second (and fourth) lens value setting step (S102), and repeats the steps from the second (and fourth) lens value setting step (S102) to the image rotation determination step (S112) until the rotational deviation has been eliminated. If the three or more electrostatic lenses 212, 214, and 216 are used as the magnification adjustment lens system 210, no image rotation deviation usually occurs. If electromagnetic lenses are used as the magnification adjustment lens system 210, since image rotational deviation may occur, excitation values are variably adjusted with respect to the second electromagnetic lens, and furthermore the fourth electromagnetic lens in the second (and fourth) lens value setting step (S102) (refer to FIG. 8). By making an adjustment such that the sum of the excitation values f1 to f4 which are for the first to fourth electromagnetic lenses is zero, in other words, by making an adjustment such that the integral value of the magnetic field along a axis is zero, it is possible not to produce an image rotation between an image going into the first electromagnetic lens and an image going out from the fourth electromagnetic lens. If no image rotational deviation occurs, magnification adjustment including rotation ends. Therefore, writing can be performed with a magnification #1.

In the meanwhile, although it is assumed in the above description that ideal axial symmetrical lenses are used, in the case of changing lens conditions, practically, an electron trajectory may shift from the original trajectory, and/or an astigmatism may occur. When such deviation and/or astigmatism exceeds an acceptable range, optical axis adjustment and astigmatism correction are performed by adjusting an alignment coil and/or stigmator (not shown).

In the magnification change necessity determination step (S114), it is determined whether it is necessary to change the magnification of a shot figure from magnification #1 to magnification #2. As described above, a required maximum shot size of a shot figure differs in accordance with layout of a pattern to be written. Therefore, it is determined whether it is necessary to change the magnification of a shot figure from magnification #1 to magnification #2 in accordance with a pattern to be written. If there is no necessity for changing the magnification, it progresses to the writing step (S116).

In the magnification change necessity determination step (S114), if there is necessity for changing the magnification, in the state where a plurality of crossover positions of the electron beam 200 and positions of all the intermediate images (one or more intermediate images) of the second aperture image (S2 image) are adjusted to matching positions with respect to the second aperture image (S2 image) with magnification #1, the magnification of the second aperture image (S2 image) is changed from the magnification #1 to the magnification #2 by using the magnification adjustment lens system 210 composed of a plurality of lenses while maintaining the last crossover position (C.O.4) of the electron beam 200 and the position of the last intermediate image of the second aperture image (S2 image) to be fixed (unchanged). Then, in the case of changing magnification #1 to magnification #2, a plurality of lenses configuring the magnification adjustment lens system 210 make rotation of the second aperture image (S2 image) formed on the surface of the target object 101 not occur. Specifically, it returns to the second (and fourth) lens value setting step (S102), and repeats the steps from the second (and fourth) lens value setting step (S102) to the magnification change necessity determination step (S114) until the magnification is changed from the magnification #1 to a desired magnification #2.

Figure 7:
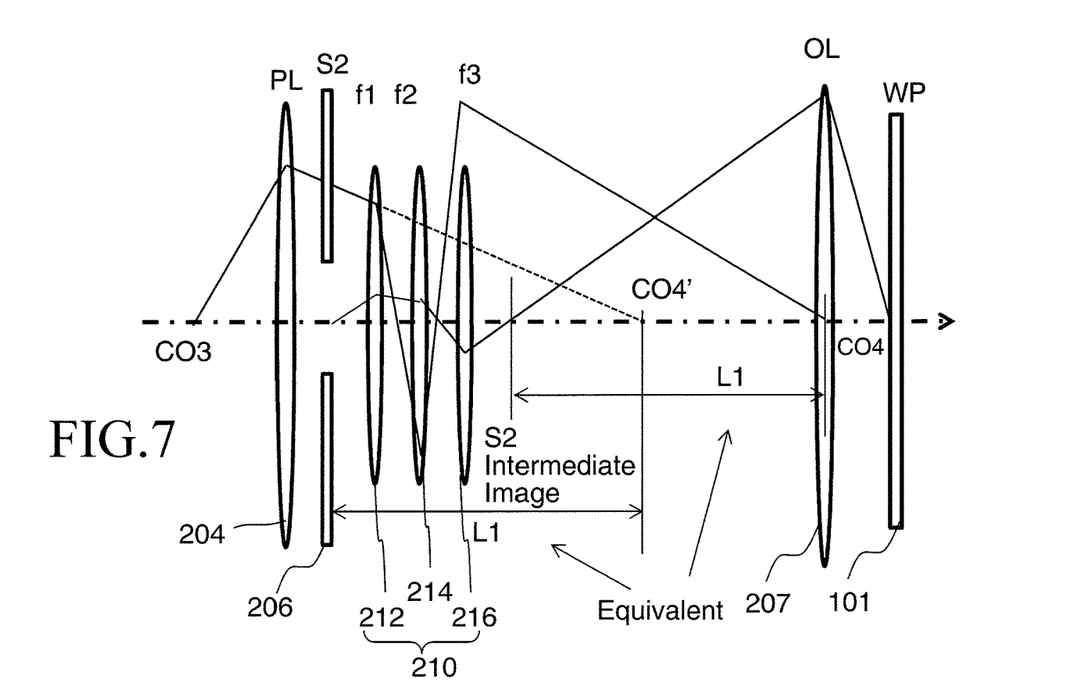
FIG. 7 shows another example of a trajectory of the crossover system of an electron beam and a trajectory of the image forming system of an aperture image in the case of adjusting magnification by using three electrostatic lenses according to the first embodiment.

FIG. 7 shows another example of a trajectory of the crossover system of an electron beam and a trajectory of the image forming system of an aperture image in the case of adjusting magnification by using three electrostatic lenses according to the first embodiment. FIG. 7 shows an example of increasing the magnification of the second aperture image (S2 image) formed on the surface of the target object 101 from the magnification state shown in FIG. 6. FIG. 7 shows, similarly to FIG. 6, an example of the crossover system trajectory of the electron beam 200 from the convergence point 3 (C.O.3) to the convergence point 4 (C.O.4), and an example of the image forming system trajectory of the second aperture image (S2 image) formed by the second shaping aperture substrate 206. The electron beam 200 having passed the convergence point 3 (C.O.3) is refracted by the projection lens 204, and converges toward the convergence point 4' (C.O.4'). When the three electrostatic lenses 212, 214, and 216 are not arranged, the objective lens 207 is in design arranged at the position of the convergence point 4' (C.O.4'). In other words, when the three electrostatic lenses 212, 214, and 216 are not arranged, each of the heights of the objective lens 207 and the surface of the target object 101 (target object arrangement plane of the XY stage 105) is shifted toward the optical axis upper part by the distance between the convergence point 4' (C.O.4') and the convergence point 4 (C.O.4). According to the first embodiment, the crossover position is moved to the convergence point 4 (C.O.4) from the convergence point 4' (C.O.4') by the lens effect (action) of the three electrostatic lenses 212, 214, and 216. The process up to this point is the same as the case of FIG. 6. In FIG. 7, by the lens effect (action) of the three electrostatic lenses 212, 214, and 216, the second aperture image (S2 image) on the surface of the target object 101 is magnified. In that case, it is set such that the distance between the plane where the second aperture image (S2 image) is formed by the second shaping aperture substrate 206 and the convergence point 4' (C.O.4') is equal to the distance between the last intermediate image of the second aperture image (S2 image) at the time of repeating image formation once or more by the lens effect (action) of the three electrostatic lenses 212, 214, and 216 and the convergence point 4 (C.O.4), namely it is set such that both the distances are the same L1. In other words, a plurality of electrostatic lenses 212, 214, and 216 change the magnification of the second aperture image (S2 image) from magnification #1 (first magnification) in FIG. 6 to magnification #2 (second magnification) in FIG. 7 while maintaining the convergence point 4 (C.O.4) being the last crossover position of the electron beam 200 and the position of the last intermediate image of the second aperture image (S2 image) to be fixed (unchanged). Moreover, when changing the magnification, a plurality of electrostatic lenses 212, 214, and 216 make an adjustment so that the second aperture image (S2 image) may not rotate on the surface of the target object 101.

Figure 8:
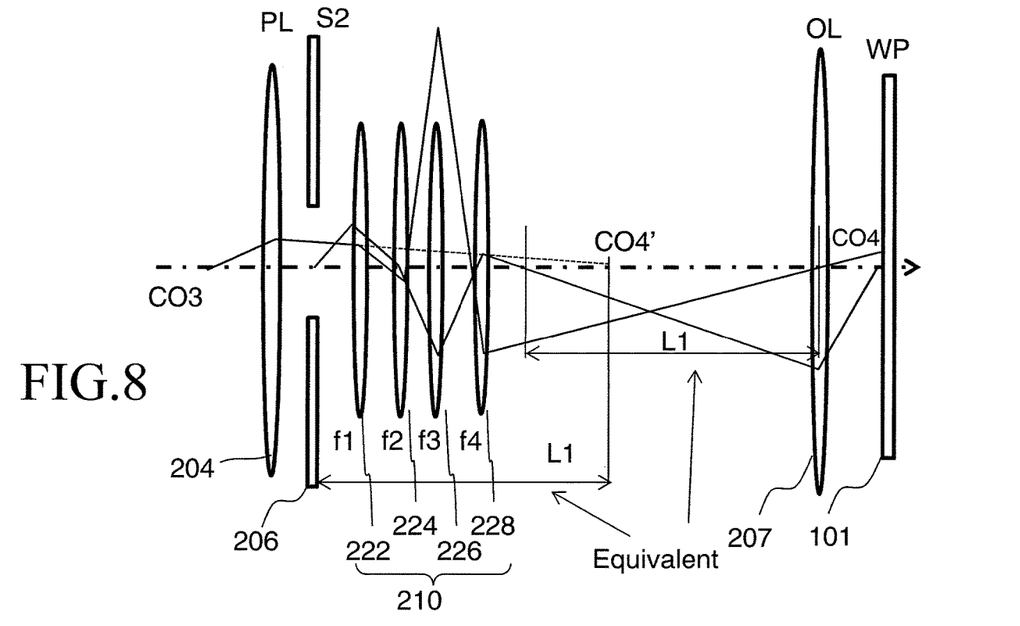
FIG. 8 shows an example of a trajectory of the crossover system of an electron beam and a trajectory of the image forming system of an aperture image in the case of adjusting magnification by using four electromagnetic lenses according to a modified example of the first embodiment.

FIG. 8 shows an example of a trajectory of the crossover system of an electron beam and a trajectory of the image forming system of an aperture image in the case of adjusting magnification by using four electromagnetic lenses according to a modified example of the first embodiment. In FIG. 8, the magnification adjustment lens system 210 is composed of four electromagnetic lenses 222, 224, 226, and 228 (a plurality of lenses). In FIG. 8, the electron beam 200 having passed the convergence point 3 (C.O.3) is refracted by the projection lens 204, and converges toward the convergence point 4' (C.O.4'). When the four electromagnetic lenses 222, 224, 226, and 228 are not arranged, the objective lens 207 is in design arranged at the position of the convergence point 4' (C.O.4'). In other words, when the four electromagnetic lenses 222, 224, 226, and 228 are not arranged, each of the heights of the objective lens 207 and the surface of the target object 101 (target object arrangement plane of the XY stage 105) is shifted toward the optical axis upper part by the distance between the convergence point 4' (C.O.4') and the convergence point 4 (C.O.4). According to the first embodiment, the crossover position is moved to the convergence point 4 (C.O.4) from the convergence point 4' (C.O.4') by the lens effect (action) of the four electromagnetic lenses 222, 224, 226, and 228. In FIG. 8, the second aperture image (S2 image) on the surface of the target object 101 is adjusted to have a desired magnification #1, and further magnified from the desired magnification #1 to magnification #2, by the lens effect (action) of the four electromagnetic lenses 222, 224, 226, and 228. When adjusting to the magnification #1, and to the magnification #2, in either case, it is set such that the distance between the plane where the second aperture image (S2 image) is formed by the second shaping aperture substrate 206 and the convergence point 4' (C.O.4') is equal to the distance between the last intermediate image of the second aperture image (S2 image) at the time of repeating image formation once or more by the lens effect (action) of the four electromagnetic lenses 222, 224, 226, and 228 and the convergence point 4 (C.O.4), namely it is set such that both the distances are the same L1. In other words, a plurality of electromagnetic lenses 222, 224, 226, and 228 change the magnification of the second aperture image (S2 image) on the surface of the target object 101 from the magnification #1 to magnification #2 (second magnification) in FIG. 8 while maintaining the convergence point 4 (C.O.4) being the last crossover position of the electron beam 200 and the position of the last intermediate image of the second aperture image (S2 image) to be fixed (unchanged). Moreover, when changing the magnification, a plurality of electromagnetic lenses 222, 224, 226, and 228 make an adjustment so that the second aperture image (S2 image) may not rotate on the surface of the target object 101.

When the first shaping aperture substrate 203 and the second shaping aperture substrate 206 are fixed on the aperture holding systems which have aperture rotating mechanism, the orientations of the aperture 411 and the variable shape aperture 421 can be mechanically adjusted. By adding the aperture orientation adjusting procedure in the column adjustment (for example, S112 step in FIG. 5), the margin for the lens adjustment can be widened.

Figure 9:
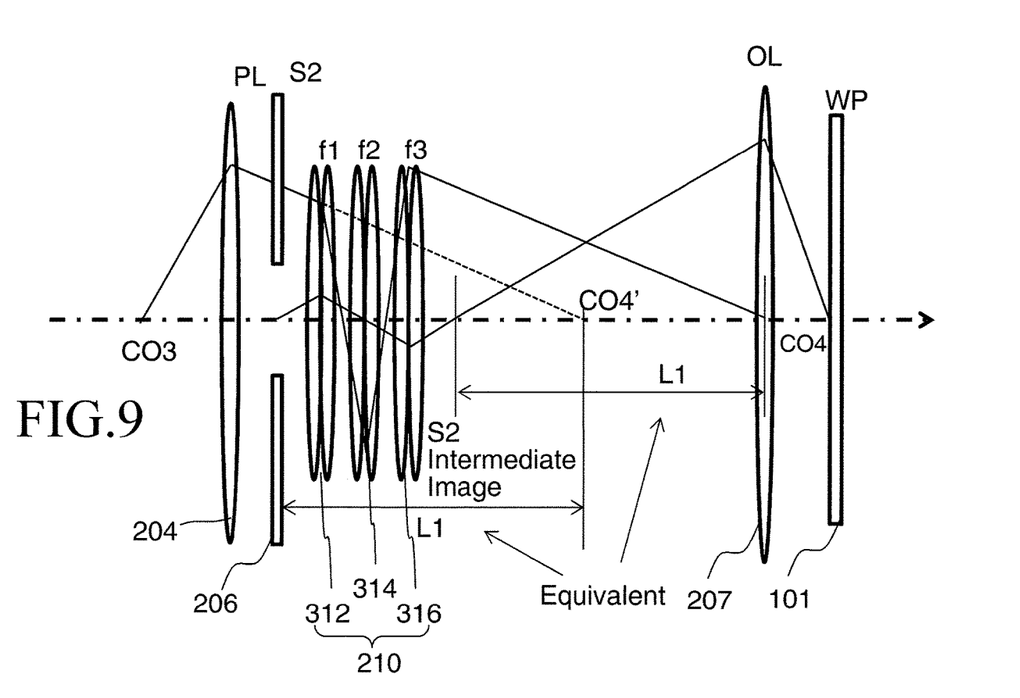
FIG. 9 shows an example of a trajectory of the crossover system of an electron beam and a trajectory of the image forming system of an aperture image in the case of adjusting magnification using three doublet lenses each obtained by pairing two adjacent electromagnetic lenses and giving the same excitation inversely to each of the adjacent electromagnetic lenses, (that is performing antisymmetric excitation), according to a modified example of the first embodiment.

FIG. 9 shows an example of a trajectory of the crossover system of an electron beam and a trajectory of the image forming system of an aperture image in the case of adjusting magnification using three doublet lenses each obtained by pairing two adjacent electromagnetic lenses and giving the same excitation inversely to each of the adjacent electromagnetic lenses, (that is performing antisymmetric excitation), according to a modified example of the first embodiment. In FIG. 9, the magnification adjustment lens system 210 is composed of three doublet electromagnetic lenses 312, 314, and 316 (a plurality of lenses). Here, it is assumed that the lens magnetic field generated by the doublet lenses 312, 314, and 316 sufficiently decays at the S2 position and the S2 intermediate image position. In FIG. 9, the electron beam 200 having passed the convergence point 3 (C.O.3) is refracted by the projection lens 204, and converges toward the convergence point 4' (C.O.4'). When the three doublet lenses 312, 314, and 316 are not arranged, the objective lens 207 is in design arranged at the position of the convergence point 4' (C.O.4'). In other words, when the three doublet lenses 312, 314, and 316 are not arranged, each of the heights of the objective lens 207 and the surface of the target object 101 (target object arrangement plane of the XY stage 105) is shifted toward the optical axis upper part by the distance between the convergence point 4' (C.O.4') and the convergence point 4 (C.O.4). According to the first embodiment, the crossover position is moved to the convergence point 4 (C.O.4) from the convergence point 4' (C.O.4') by the lens effect (action) of the three doublet lenses 312, 314, and 316. In FIG. 9, the second aperture image (S2 image) on the surface of the target object 101 is adjusted to have a desired magnification #1, and further magnified from the desired magnification #1 to magnification #2, by the lens effect (action) of the three doublet lenses 312, 314, and 316. When adjusting to the magnification #1, and to the magnification #2, in either case, it is set such that the distance between the plane where the second aperture image (S2 image) is formed by the second shaping aperture substrate 206 and the convergence point 4' (C.O.4') is equal to the distance between the last intermediate image of the second aperture image (S2 image) at the time of repeating image formation once or more by the lens effect (action) of the three doublet lenses 312, 314, and 316 and the convergence point 4 (C.O.4), namely it is set such that both the distances are the same L1. In other words, a plurality of doublet lenses 312, 314, and 316 change the magnification of the second aperture image (S2 image) on the surface of the target object 101 from the magnification #1 to magnification #2 (second magnification) in FIG. 9 while maintaining the convergence point 4 (C.O.4) being the last crossover position of the electron beam 200 and the position of the last intermediate image of the second aperture image (S2 image) to be fixed (unchanged). Moreover, when changing the magnification, a plurality of doublet lenses 312, 314, and 316 make an adjustment so that the second aperture image (S2 image) may not rotate on the surface of the target object 101. By inversely giving the same excitation to each of the paired electromagnetic lenses, (that is performing antisymmetric excitation), it is possible to make each of the doublet lenses 312, 314, and 316 inhibit the rotation of an image, similarly to the case of using the three electrostatic lenses 212, 214, and 216. When the magnetic field of the doublet lenses 312, 314, and 316 cannot be ignored at the S2 aperture position and its upstream, and at the S2 intermediate image position and its downstream, if excitation of the doublet lens 312 is changed, rotation occurs somewhat in the S2 image. In that case, considering similarly to the case of FIG. 8, it is possible to perform correction by applying some asymmetry to the excitation magnetic field through giving somewhat different values of current to each of the doublet lenses.

In the writing step (S116), the writing mechanism 150 focuses and forms the second aperture image (S2 image), whose magnification has been adjusted, on the surface of the target object so as to perform writing. In other words, using the objective lens 207, the writing mechanism 150 focuses and forms the second aperture image (S2 image) with magnification #1 (or changed to magnification #2) on the surface of the target object 101, and writes a shot figure of the second aperture image (S2 image). According to the first embodiment, since the convergence point 4 (C.O.4) being the last crossover position of the electron beam 200 is fixed (unchanged), it is possible to maintain it at the central height position of the objective lens 207, thereby highly accurately maintaining the size of the shot figure to be written on the surface of the target object. Moreover, since the position of the last intermediate image of the second aperture image (S2 image) is fixed (unchanged), it is possible to maintain the focal distance of the objective lens 207 while changing the magnification. Therefore, blurring of the second aperture image (S2 image) (shot figure) written on the surface of the target object can be suppressed or reduced.

As described above, according to the first embodiment, magnification of an aperture image can be adjusted while maintaining writing accuracy in electron beam writing.

Embodiments have been explained referring to specific examples described above. However, the present invention is not limited to these specific examples. In the above examples, the convergence point 4 (C.O.4) being the last crossover position of the electron beam 200 is maintained at the intermediate height position of the objective lens 207, and the second aperture image (S2 image) (shot figure) converges toward the surface of the target object 101, but it is not limited thereto. It is also preferable, based on KShler illumination conditions, that the second aperture image (S2 image) (shot figure) from the objective lens 207 is incident in parallel (here, vertically) to the surface of the target object 101. In such a case, it is also preferable that magnification adjustment is performed maintaining the convergence point 4 (C.O.4), being the last crossover position of the electron beam 200, on the front focal plane of the objective lens 207. Then, if the electron beam 200 used as the second aperture image (S2 image) is focused as the last intermediate image on the front focal plane of the objective lens 207, the target object 101 is illuminated uniformly, which makes it possible to let the size of an image be fixed (unchanged) even if the surface of the target object 101 shifts up and down. Moreover, although the VSB electron beam writing apparatus has been described in the above examples, it is not limited thereto. The present invention can be similarly applied to the electron beam writing for transferring an aperture image. For example, it can be similarly applied to the multi beam writing apparatus.

Further, the time required for adjustment can be reduced by previously obtaining, by way of measurement and the like, lens conditions corresponding to expected desired magnification, or/and conditions for an alignment coil and a stigmator to store them in a storage device (not shown), and acquiring the lens conditions, etc., described in table, corresponding to a desired magnification, etc. from the storage device so as to treat the acquired ones as initial conditions for adjustment when changing magnification. Even when a desired magnification is not written in the stored table, as long as there is a magnification close to the desired one, initial conditions for adjustment can be obtained by interpolation and/or extrapolation, which is effective in reducing the time required for the adjustment. Although the lens conditions, etc. corresponding to a desired magnification, etc. which were stored in the storage device may change by hysteresis of a pole piece in an electromagnetic lens, and the like, updating the lens conditions, etc. is recommended in that case.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other charged particle beam writing apparatus, incident angle adjustment method for beam incident to target object surface, and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
   forming an aperture image by making a charged particle beam pass through an aperture substrate;
   changing, in a state where a plurality of crossover positions of the charged particle beam and positions of all of one or more intermediate images of the aperture image are adjusted to matching positions with respect to the aperture image with a first magnification, magnification of the aperture image from the first magnification to a second magnification by using a plurality of lenses while maintaining a last crossover position of the charged particle beam and a position of a last intermediate image of the aperture image to be fixed; and
   forming, using an objective lens, the aperture image whose magnification has been changed to the second magnification on a surface of a target object, and writing the aperture image.

2. The method according to claim 1, wherein, in a case of changing the first magnification to the second magnification, the plurality of lenses make rotation of the aperture image formed on the surface of the target object not occur.

3. The method according to claim 1, wherein three or more electrostatic lenses are used as the plurality of lenses.

4. The method according to claim 1, wherein four or more electromagnetic lenses are used as the plurality of lenses.

5. The method according to claim 1, wherein the one or more intermediate images of the aperture image are formed by at least one of the plurality of the lenses.

6. The method according to claim 1, wherein the changing the magnification of the aperture image by using the plurality of lenses includes
   setting lens values of some lenses of the plurality of lenses;
   setting, after the setting lens values of the some lenses of the plurality of lenses, lens values of rest of the plurality of lenses; and
   measuring a size of the aperture image.

7. The method according to claim 6, wherein the changing the magnification of the aperture image by using the plurality of lenses further includes
   determining, after the measuring the size of the aperture image, whether a last crossover position is located at a predetermined position.

8. The method according to claim 1 further comprising:
   determining, before changing the magnification of the aperture image, whether it is necessary to change the magnification of the aperture image.

9. The method according to claim 1 further comprising:
   determining, in accordance with a pattern to be written, whether it is necessary to change the magnification of the aperture image.

10. A charged particle beam writing apparatus comprising:
    an emission source configured to emit a charged particle beam;
    a stage configured to mount thereon a target object;
    an aperture substrate configured to form an aperture image by making the charged particle beam pass therethrough;
    an objective lens configured to focus and form the aperture image on the target object; and
    a plurality of lenses arranged between the aperture substrate and the objective lens, configured to maintain a last crossover position of the charged particle beam and a position of a last intermediate image of the aperture image to be fixed and change magnification of the aperture image from a first magnification to a second magnification while maintaining the last crossover position of the charged particle beam and the position of the last intermediate image of the aperture image to be fixed,
    wherein four or more electromagnetic lenses are used as the plurality of lenses.

* * * * *